(12) United States Patent
Kung et al.

(10) Patent No.: US 11,581,225 B2
(45) Date of Patent: Feb. 14, 2023

(54) METHOD FOR MANUFACTURING SEMICONDUCTOR DEVICE

(71) Applicant: Shanghai Huali Integrated Circuit Corporation, Shanghai (CN)

(72) Inventors: Changhung Kung, Shanghai (CN); Ting Ye, Shanghai (CN); Xiumei Hu, Shanghai (CN); Jianxun Chen, Shanghai (CN); Chanyuan Hu, Shanghai (CN)

(73) Assignee: Shanghai Huali Integrated Circuit Corporation, Shanghai (CN)

( * ) Notice: Subject to any disclaimer, the term of this patent is extended or adjusted under 35 U.S.C. 154(b) by 50 days.

(21) Appl. No.: 17/218,505

(22) Filed: Mar. 31, 2021

(65) Prior Publication Data

US 2021/0375689 A1   Dec. 2, 2021

(30) Foreign Application Priority Data

May 29, 2020   (CN) .......................... 202010476192.9

(51) Int. Cl.
*H01L 29/423* (2006.01)
*H01L 21/8234* (2006.01)
*H01L 21/28* (2006.01)
*H01L 27/088* (2006.01)

(52) U.S. Cl.
CPC ............... *H01L 21/823456* (2013.01); *H01L 21/28114* (2013.01); *H01L 27/088* (2013.01); *H01L 29/42376* (2013.01)

(58) Field of Classification Search
CPC . H01L 21/28; H01L 21/8234; H01L 21/8238; H01L 21/28114; H01L 21/823456; H01L 21/823437; H01L 21/823842; H01L 27/088; H01L 29/66; H01L 29/78; H01L 29/423; H01L 29/42376; H01L 29/6656; H01L 29/66545; H01L 29/7831; H01L 29/7832; H01L 29/66484; H01L 29/4925; H01L 29/4941; H01L 29/4958; H01L 21/768; H01L 21/76834; H01L 21/28247; H01L 21/823468; H01L 21/823462; H01L 21/823418; H01L 21/823814; H01L 21/823864; H01L 21/7832
USPC ........................................................ 438/595
See application file for complete search history.

(56) References Cited

U.S. PATENT DOCUMENTS

| | | | |
|---|---|---|---|
| 2010/0087038 A1* | 4/2010 | Chung | H01L 21/823842 257/E21.632 |
| 2012/0025323 A1* | 2/2012 | Teo | H01L 29/401 257/E27.06 |
| 2019/0081041 A1* | 3/2019 | Thei | H01L 27/04 |

* cited by examiner

*Primary Examiner* — Chuong A Luu
(74) *Attorney, Agent, or Firm* — Banner & Witcoff, Ltd.

(57) ABSTRACT

A method for manufacturing a semiconductor device comprising: providing a substrate, wherein a first gate structure corresponding to a dense area transistor and a second gate structure corresponding to an isolated area transistor are formed on the substrate, and the first gate structure is higher than the second gate structure; forming a buffer layer over the second gate structure, wherein the upper surface of the buffer layer is flush with the upper surface of the first gate structure; and removing the top of the first gate structure, and forming a hard mask filling layer on a top area of the first gate structure.

9 Claims, 11 Drawing Sheets

METHOD FOR MANUFACTURING SEMICONDUCTOR DEVICE

CROSS-REFERENCES TO RELATED APPLICATIONS

This application claims priority to Chinese patent application No. 202010476192.9, filed on May 29, 2020, the disclosure of which is incorporated herein by reference in entirety.

TECHNICAL FIELD

The present application relates to the field of semiconductor device manufacturing, in particular to a method for manufacturing semiconductor devices in different dense areas on a chip.

BACKGROUND

Since the early day when Dr. Jack Kilby of Texas Instruments invented the integrated circuit, scientists and engineers have made numerous inventions and improvements in the aspects of semiconductor device and process. The size of semiconductors has been significantly reduced in the past 50 years, leading to a continuous increase in the processing speed and a continuous reduction in the power consumption. So far, the development of semiconductors generally follows the Moore's Law. The Moore's Law generally indicates that the number of transistors in a dense integrated circuit doubles approximately every two years. Currently, the semiconductor process is developing towards a node below 20 nm, and some companies are working on the 14-nm process. A reference is provided herein, wherein the diameter of a silicon atom is about 0.2 nm, which means that the distance between two independent components manufactured by means of the 20-nm process is only about the sum of the diameters of a hundred silicon atoms. Therefore, the manufacturing of semiconductor devices becomes increasingly challenging and develops towards the feasible physical limit.

With the development of the integrated circuit, the device size becomes increasingly small, and the integration level becomes increasingly high. In the current advanced logic chip process, various component designs with different densities may cause a severe loading effect between devices in a chip during process manufacturing. Due to the severe loading effect, there are various differences between a device in a dense area and a device in an isolated area, leading to negative impacts of different degrees on the dense area device or isolated area device in some processes that require synchronous operations on the dense area device and isolated area device, and thereby resulting in a reduction in the product yield.

In view of the above, there is an urgent need for a method for manufacturing a semiconductor device, to effectively alleviate the severe loading effect caused by an uneven device distribution on a chip and avoid the degradation of device performance due to different densities of various areas on the chip, thereby effectively improving the performance of the semiconductor device and the product yield.

BRIEF SUMMARY

A brief overview of one or more aspects is provided below to provide a basic understanding of these aspects. The overview is not a detailed and comprehensive overview of all the conceived aspects, and is neither intended to identify the key or decisive elements of all the aspects, nor is it attempt to define the scope of any or all of the aspects. The sole purpose is to present some concepts of one or more aspects in a simplified form as a prelude to the more detailed description provided subsequently.

In order to solve the above problem, the present application provides a method for manufacturing a semiconductor device, specifically comprising steps of:

providing a substrate, wherein a first gate structure corresponding to a dense area transistor and a second gate structure corresponding to an isolated area transistor are formed on the substrate, and the first gate structure is higher than the second gate structure;

forming a buffer layer over the second gate structure, wherein the upper surface of the buffer layer is flush with the upper surface of the first gate structure; and removing the top of the first gate structure, and forming a hard mask filling layer on a top area of the first gate structure.

In the above embodiment, by forming the buffer layer over the second gate structure, the second gate structure can have the same height as the first gate structure in subsequent manufacturing processes, thereby effectively alleviating a severe loading effect. In addition, the formed buffer layer can also serve as a protective layer for the second gate structure during a subsequent process of removing the top of the first gate structure, so as to protect the top of the second gate structure from being removed by mistake.

In an embodiment of the manufacturing method, optionally, forming the buffer layer comprises steps of:

depositing a buffer dielectric layer covering the first gate structure and the second gate structure over the first gate structure and the second gate structure; and planarizing the buffer dielectric layer by using the upper surface of the first gate structure as a stop layer, to re-expose the upper surface of the first gate structure, and retaining the buffer dielectric layer over the second gate structure as the buffer layer.

In the above embodiment, after the buffer dielectric layer covering the first gate structure and the second gate structure is formed over the first gate structure and the second gate structure, that is, after the buffer dielectric layer formed over the second gate structure is higher than the upper surface of the first gate structure, the buffer dielectric layer can be planarized by using the upper surface of the first gate structure as an etching stop layer, so that the upper surface of the buffer dielectric layer over the second gate structure is flush with the upper surface of the first gate structure.

In an embodiment of the manufacturing method, optionally, a first interlayer dielectric layer is formed on either side of the first gate structure, and the upper surface of the first interlayer dielectric layer is flush with the upper surface of the first gate structure;

a second interlayer dielectric layer is formed on either side of the second gate structure, and the upper surface of the second interlayer dielectric layer is flush with the upper surface of the second gate structure; and the deposited buffer dielectric layer also covers the first interlayer dielectric layer and the second interlayer dielectric layer.

In an embodiment of the manufacturing method, optionally, each of the buffer dielectric layer, the first interlayer dielectric layer, and the second interlayer dielectric layer is an oxide.

In an embodiment of the manufacturing method, optionally, the buffer dielectric layer is deposited by means of a high-density plasma process, a high-aspect-ratio process, or a plasma-enhanced process.

In an embodiment of the manufacturing method, optionally, the first gate structure further comprises a dense area transistor gate, and a first sidewall and a second sidewall that are sequentially arranged on either side of the dense area transistor gate from inside to outside;

removing the top of the first gate structure comprises:
removing the tops of the dense area transistor gate and of the first sidewall on either side thereof; and
forming the hard mask filling layer on the top area of the first gate structure comprises:
forming the hard mask filling layer on top areas of the dense area transistor gate and of the first sidewall on either side thereof.

In an embodiment of the manufacturing method, optionally, forming the hard mask filling layer on the top areas of the dense area transistor gate and of the first sidewall on either side thereof comprises steps of:

depositing, in a groove surrounded by the second sidewall, a hard mask dielectric layer protruding from the groove after the tops of the dense area transistor gate and of the first sidewall on either side thereof are removed; and planarizing the hard mask dielectric layer to remove the hard mask dielectric layer protruding from the groove, and retaining the hard mask dielectric layer in the groove as the hard mask filling layer.

In an embodiment of the manufacturing method, optionally, depositing the hard mask dielectric layer comprises steps of:

synchronously depositing the hard mask dielectric layer on the upper surface of the buffer layer; and synchronously planarizing the hard mask dielectric layer over the buffer layer by using the upper surface of the buffer layer as a stop layer, to remove the hard mask dielectric layer over the buffer layer.

In an embodiment of the manufacturing method, optionally, the hard mask dielectric layer is a nitride.

In an embodiment of the manufacturing method, optionally, the dense area transistor gate is a metal gate; and/or
an isolated area transistor gate in the second gate structure is a metal gate.

In an embodiment of the manufacturing method, optionally, the gate width of the first gate structure is less than 0.24 micrometers, and the gate width of the second gate structure is greater than 0.24 micrometers.

According to the method for manufacturing a semiconductor device provided by the present application, a severe loading effect caused by an uneven device distribution on a chip can be effectively alleviated by forming a buffer layer on the upper surface of a device in a pattern isolated area. In addition, the formed buffer layer can also subsequently serve as a protective layer for the device in the pattern isolated area, to improve the problem of a silicon nitride residue on the upper surface of a gate structure of an isolated area transistor which undergoes a self-aligned silicon nitride process, thereby effectively improving the performance of the device and increasing the product yield.

BRIEF DESCRIPTION OF THE DRAWINGS

By reading the detailed description of the embodiments of the present disclosure with reference to the following drawings, one can better understand the above-mentioned features and advantages of the present application. In the drawings, various components are not necessarily drawn to scale, and components with similar related characteristics or features may have the same or similar reference numerals.

DETAILED DESCRIPTION OF THE DISCLOSURE

Figure 1:
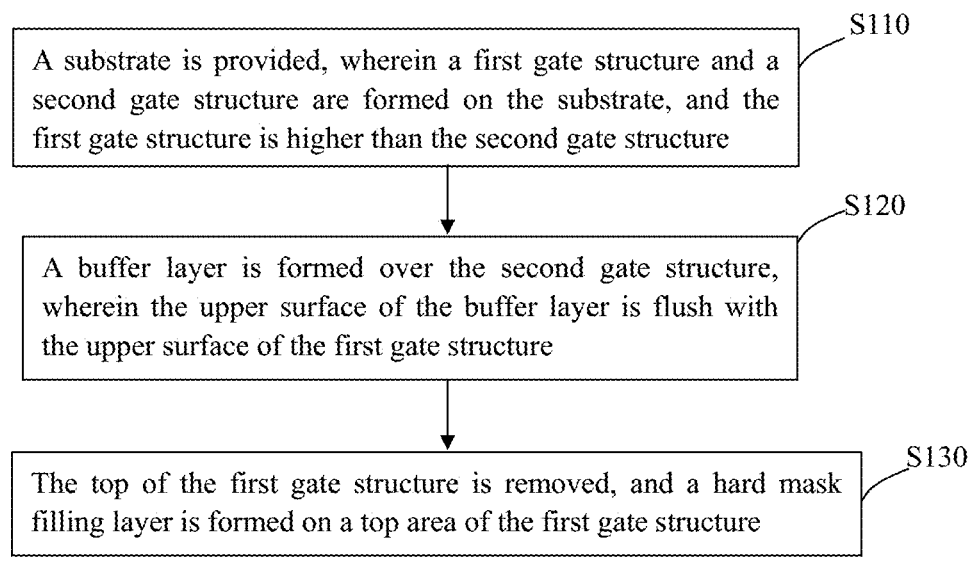
FIG. 1 illustrates a flowchart of a manufacturing method provided in one aspect of the present application.

The present application is described in detail below with reference to the drawings and specific embodiments. It should be noted that the following aspects described with reference to the drawings and specific embodiments are merely some examples and should not be construed as any limitation on the protection scope of the present application.

The present application relates to a semiconductor device manufacturing process. According to a method for manufacturing a semiconductor device provided by the present application, a self-aligned silicon nitride process of the semiconductor device can be completed by means of a highly compatible process. According to the manufacturing process provided by the present application, a severe loading effect caused by an uneven device distribution on a chip can be effectively alleviated. In addition, a formed buffer layer can also subsequently serve as a protective layer for a device in a pattern isolated area, to improve the problem of a silicon nitride residue on the upper surface of a gate structure of an isolated area transistor which undergoes a self-aligned silicon nitride process, thereby effectively improving the performance of the device and increasing the product yield.

The following description is provided to enable those skilled in the art to implement and use the present application and incorporate it into specific application contexts. Various modifications and various uses in different applications are apparent to those skilled in the art, and the general principles defined herein can be applied to a wide range of embodiments. Therefore, the present application is not limited to the embodiments provided herein, but should be granted the broadest scope consistent with the principles and novel features disclosed herein.

In the following detailed description, many specific details are set forth to provide a more thorough understanding of the present application. However, it is obvious to those skilled in the art that the practice of the present application may not necessarily be limited to these specific details. In other words, the well-known structures and devices are shown in block diagram forms and are not shown in detail, so as to avoid obscuring the present application.

Readers should be noted that all files and documents submitted with this specification and open to the public to consult this specification, and the contents of all of the files and documents are incorporated herein by reference. Unless otherwise stated directly, all the features disclosed in this specification (including any appended claims, abstract, and drawings) can be replaced by alternative features for achieving the same, equivalent, or similar purpose. Therefore, unless otherwise stated expressly, each feature disclosed is only an example of a set of equivalent or similar features.

It should be noted that when used, the left, right, front, rear, top, bottom, head, tail, clockwise, and counterclockwise signs are used for convenience only, and do not imply any specific direction. In fact, they are used to reflect the relative position and/or orientation between various parts of an object.

As used herein, the terms "over", "under", "between", and "on" refer to a relative position of one layer relative to another layer. Likewise, for example, a layer deposited or placed over or under another layer may directly contact the other layer or may be separated from the other layer by one or more intermediate layers. Moreover, a layer deposited or placed between layers may directly contact the layers or may be separated from the layers by one or more intermediate layers. In contrast, a first layer "on" a second layer is in contact with the second layer. In addition, a relative position of one layer relative to the other layers is provided (assuming that deposition, modification, and film removal operations are performed relative to a base substrate, regardless of the absolute orientation of the substrate).

As stated above, in order to avoid the problems of device performance degradation and product yield reduction resulting from a severe loading effect caused by an uneven device distribution on a chip, the present application provides a method for manufacturing a semiconductor device. Referring to FIG. 1, the manufacturing method provided by the present application includes: step S110: a substrate is provided, wherein a first gate structure and a second gate structure are formed on the substrate, and the first gate structure is higher than the second gate structure; step S120: a buffer layer is formed over the second gate structure, wherein the upper surface of the buffer layer is flush with the upper surface of the first gate structure; and step S130: the top of the first gate structure is removed, and a hard mask filling layer is formed on a top area of the first gate structure.

There are various component designs of different densities for advanced logic chips. As far as the gate width is concerned, a chip can be divided into a dense area and an isolated area. In an embodiment, it can be defined that the gate width of a semiconductor device in the dense area is less than 0.24 micrometers, and the gate width of a semiconductor device in the isolated area is greater than 0.24 micrometers. In another embodiment, gates in the dense area and in the isolated area may be metal gates, so that the electrical characteristics of the devices can be effectively improved.

In the above embodiment, step S120 of forming the buffer layer includes steps of: depositing a buffer dielectric layer covering the first gate structure and the second gate structure over the first gate structure and the second gate structure; and planarizing the buffer dielectric layer by using the upper surface of the first gate structure as a stop layer, to re-expose the upper surface of the first gate structure, and retaining the buffer dielectric layer over the second gate structure as the buffer layer.

After the buffer dielectric layer covering the first gate structure and the second gate structure is formed over the first gate structure and the second gate structure, that is, after the buffer dielectric layer formed over the second gate structure is higher than the upper surface of the first gate structure, the buffer dielectric layer can be planarized by using the upper surface of the first gate structure as an etching stop layer, so that the upper surface of the buffer dielectric layer over the second gate structure is flush with the upper surface of the first gate structure.

It can be understood that a first interlayer dielectric layer is formed on either side of the first gate structure, and the upper surface of the first interlayer dielectric layer is flush with the upper surface of the first gate structure; a second interlayer dielectric layer is formed on either side of the second gate structure, and the upper surface of the second interlayer dielectric layer is flush with the upper surface of the second gate structure. In the above embodiment, the deposited buffer dielectric layer also covers the first interlayer dielectric layer and the second interlayer dielectric layer.

In an embodiment, each of the buffer dielectric layer, the first interlayer dielectric layer, and the second interlayer dielectric layer is an oxide. In the above embodiment, the buffer dielectric layer can be deposited by means of a high-density plasma process, a high-aspect-ratio process, or a plasma-enhanced process. It can be understood that the method for depositing the buffer dielectric layer can be implemented by means of an existing or future technology, and the foregoing description of the method for depositing the buffer dielectric layer should not unduly limit the protection scope of the present application.

In the above embodiment, the first gate structure provided in step S110 includes a dense area transistor gate, and a first sidewall and a second sidewall that are sequentially arranged on either side of the dense area transistor gate from inside to outside; and the second gate structure includes an isolated area transistor gate, and a first sidewall and a second sidewall that are sequentially arranged on either side of the isolated area transistor gate from inside to outside.

In the above embodiment, step S130 includes steps of: removing the tops of the dense area transistor gate and of the first sidewall on either side thereof, and forming the hard mask filling layer on top areas of the dense area transistor gate and of the first sidewall on either side thereof.

In the above embodiment, more specifically, forming the hard mask filling layer on the top areas of the dense area transistor gate and of the first sidewall on either side thereof includes steps of: depositing, in a groove surrounded by the second sidewall, a hard mask dielectric layer protruding from the groove after the tops of the dense area transistor gate and of the first sidewall on either side thereof are removed; and planarizing the hard mask dielectric layer to remove the hard mask dielectric layer protruding from the groove, and retaining the hard mask dielectric layer in the groove as the hard mask filling layer.

In the above embodiment, depositing the hard mask dielectric layer includes steps of: synchronously depositing the hard mask dielectric layer on the upper surface of the buffer layer; and synchronously planarizing the hard mask dielectric layer over the buffer layer by using the upper surface of the buffer layer as a stop layer, to remove the hard mask dielectric layer over the buffer layer.

It can be understood that, since the buffer layer is formed on the upper surface of the second gate structure in step S120, the buffer layer can serve as a protective layer for a device in the pattern isolated area in step S130, to improve the problem of a silicon nitride residue on the upper surface of a gate structure of an isolated area transistor which undergoes a self-aligned silicon nitride process, thereby effectively improving the performance of the device and increasing the product yield.

In the above embodiment, the hard mask dielectric layer and the finally formed hard mask filling layer are made of a silicon nitride, and due to the existence of the second sidewall, the formation of the hard mask filling layer made of a silicon nitride can be implemented by means of a self-alignment process. Those skilled in the art could adopt an existing or future self-aligned process to form the hard mask filling layer, and the specific implementation of forming the hard mask filling layer should not unduly limit the protection scope of the present application.

Reference is made to FIGS. 2-5 and FIGS. 6-11 to understand the manufacturing method provided by the present application. FIGS. 2-5 illustrate schematic structural diagrams in steps of a related process in the prior art. FIGS. 6-11 illustrate schematic structural diagrams in steps of the manufacturing method provided by the present application.

Figure 2:
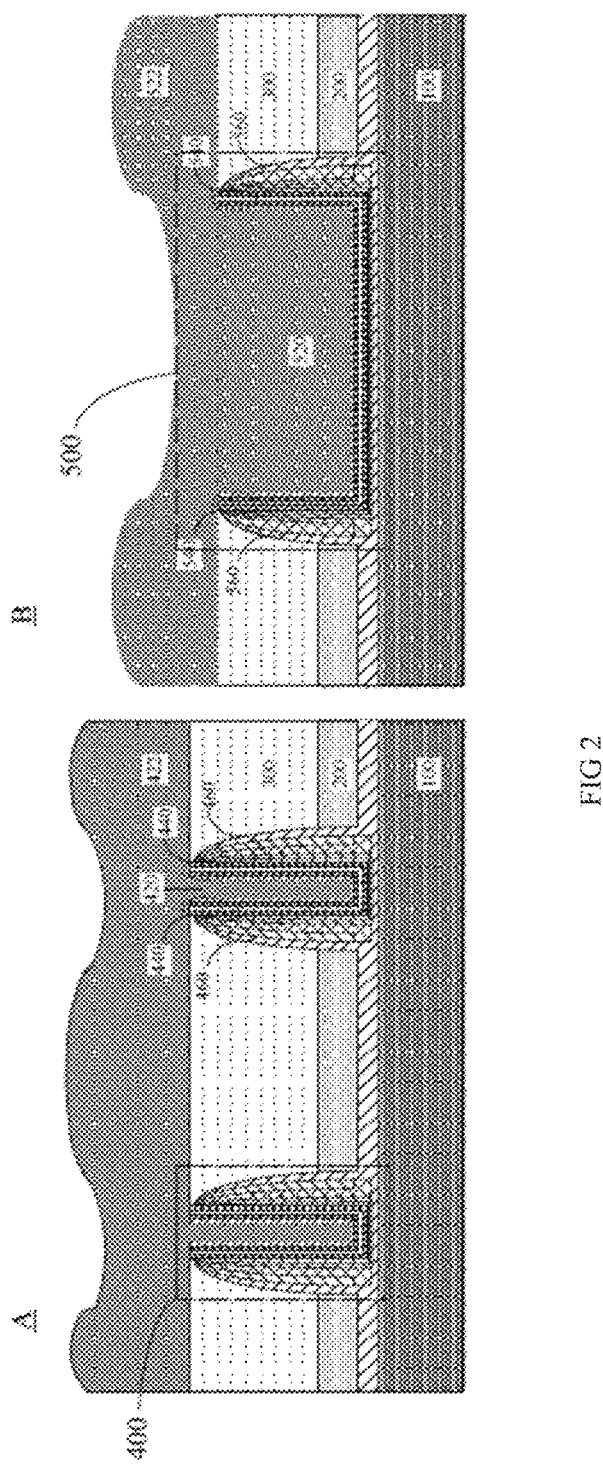
FIGS. 2-5 illustrate schematic structural diagrams of a device in a self-aligned silicon nitride process of the prior art.

First, reference is made to FIGS. 2-5 to understand the problems existing in the prior art. Referring to FIG. 2, the related process in the prior art starts from a device structure shown in FIG. 2, that is, a substrate 100 is provided, and the substrate 100 is divided into a pattern dense area A and a pattern isolated area B according to the width of a device gate. As described above, in an embodiment, the gate width of a device in the pattern dense area A is less than 0.24 micrometers, the gate width of a device in the pattern isolated area B is greater than 0.24 micrometers, and the pattern dense area and the pattern isolated area are determined according to the width of the device gate.

Further, in an embodiment, the semiconductor device processed by the manufacturing method provided by the present application is a fin semiconductor device, and therefore, a fin structure 200 is also formed over the substrate 100. It can be understood that the specific structure and formation method of the above fin structure 200 should not unduly limit the protection scope of the present application.

Referring to FIG. 2, a plurality of first gate structures 400 are formed on the substrate 100 in the pattern dense area A, and each first gate structure 400 includes a dense area transistor gate 420, a first sidewall 440 on either side of the dense area transistor gate 420, and a second sidewall 460 on either side of the first sidewall 440. It can be understood that an interlayer dielectric layer 300 filling a gap between the gate structures is formed on either side of the first gate structure 400. In an embodiment, the interlayer dielectric layer 300 is made of a silicon oxide.

A plurality of second gate structures 500 are formed on the substrate 100 in the pattern isolated area B, and each second gate structure 500 includes an isolated area transistor gate 520, a first sidewall 540 on either side of the isolated area transistor gate 520, and a second sidewall 560 on either side of the first sidewall 540. It can be understood that an interlayer dielectric layer 300 filling a gap between the gate structures is formed on either side of the second gate structure 500. In an embodiment, the interlayer dielectric layer 300 is made of a silicon oxide.

Due to the existence of various component designs with different densities and the limitation by a previous process, the heights of the interlayer dielectric layer 300 in the pattern dense area A and the interlayer dielectric layer 300 in the pattern isolated area B are different. The first gate structure 400 and the surrounding interlayer dielectric layer 300 in the pattern dense area A are higher than the first gate structure 400 and the surrounding interlayer dielectric layer 300 in the pattern isolated area B.

In the above embodiment, the first sidewalls 440 and 540 may be a gate dielectric layer or work function layer of a dense area transistor. Therefore, the first sidewalls 440 and 540 may each include a portion on the substrate 100 and a portion on the dense area transistor gate 420 or on the isolated area transistor gate 520. The second sidewalls 460 and 560 are respectively formed on either side of the first sidewalls 440 and 540. It should be noted that the first sidewalls 440 and 540 and the second sidewalls 460 and 560 can be adjusted according to the performances of different devices. The specific composition of the first sidewalls 440 and 540 and the second sidewalls 460 and 560 should not unduly limit the protection scope of the present application.

FIG. 2 illustrates a specific situation of forming the dense area transistor gate 420 and the isolated area transistor gate 520. The dense area transistor gate 420 and the isolated area transistor gate 520 may be metal gates, that is, gate layers 422 and 522 for filling are metal layers. It can be understood that the metal layer includes but is not limited to metal tungsten.

Figure 3:
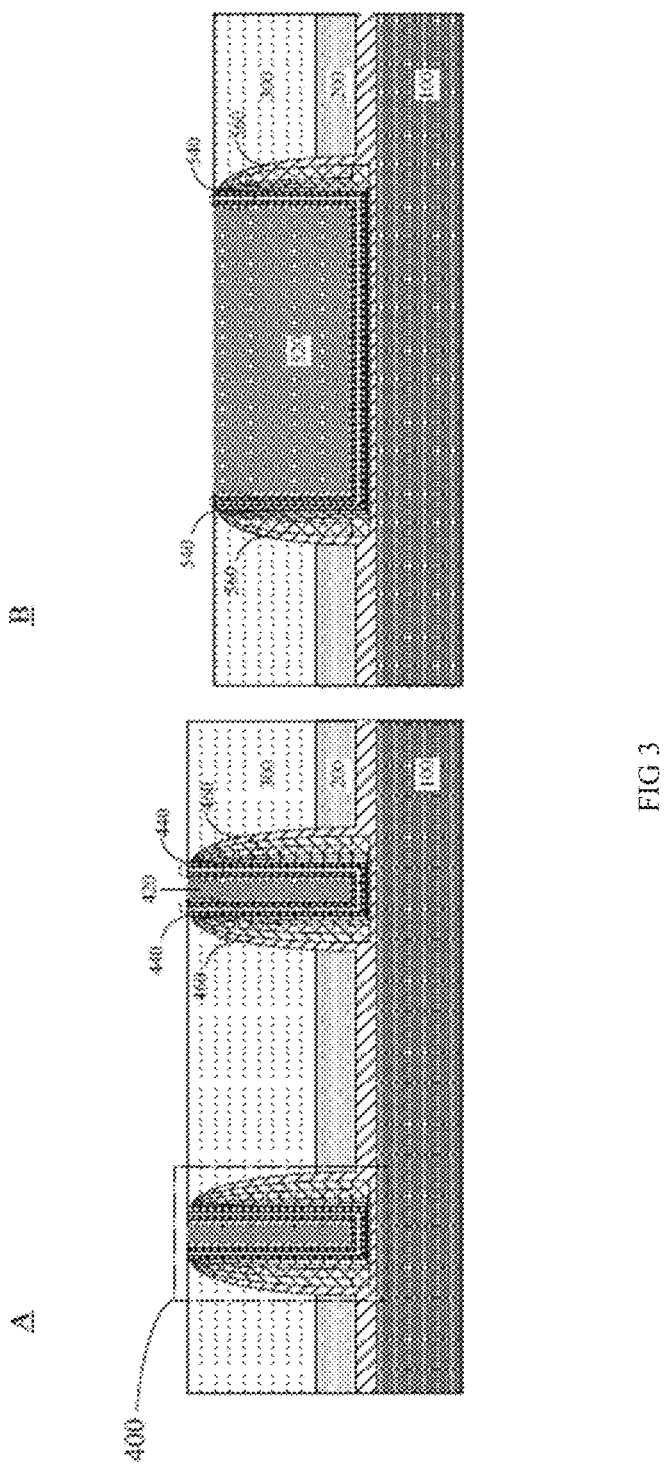

FIG. 3 illustrates a structure obtained after the gate layer 422 and the gate layer 522 are planarized. After planarization of the gate layer 422 and the gate layer 522, the dense area transistor gate 420 and the isolated area transistor gate 520 that are flush with the interlayer dielectric layer 300 can be obtained. In other words, in the planarization of the gate layer 422 and the gate layer 522, the interlayer dielectric layer 300 can be used as an etching stop layer. In FIG. 3, the upper surfaces of the dense area transistor gate 420 and the isolated area transistor gate 520 are exposed.

It can be understood that, due to the relatively small width of the dense area transistor gate 420, it is difficult to accurately ensure that a contact and a pin are only in contact with the dense area transistor gate 420 in subsequent processes of forming the contact and the pin. Therefore, problems such as short circuit and open circuit are easy to occur, thereby resulting in a reduction in the product yield.

In order to overcome the problem of difficulties in subsequent formation of the contact and the pin that satisfy requirements caused by the relatively small width of the dense area transistor gate 420, the top of the dense area transistor gate 420 can be etched back, and a top area of the first sidewall of the dense area transistor gate 420 is subsequently used to form an alignment area of the contact and the pin.

Figure 4:
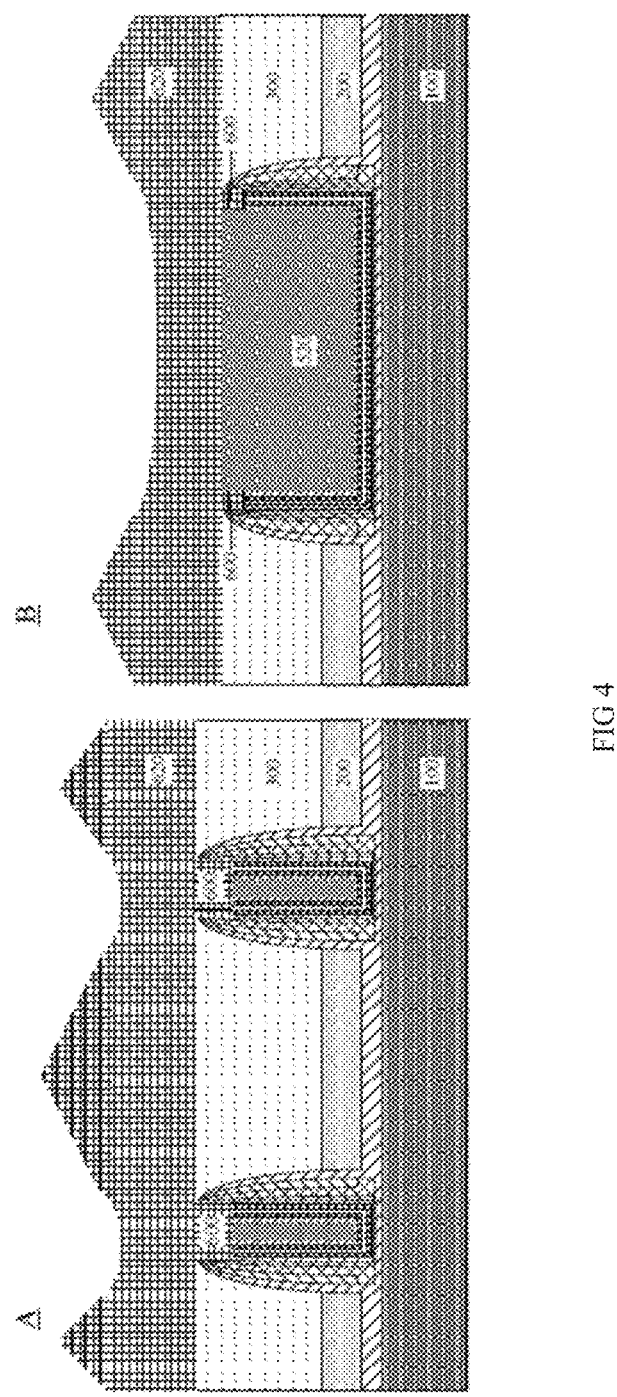

Therefore, referring to FIG. 4, it is necessary to etch back the top of the dense area transistor gate 420 and remove the top of the first sidewall 440, so that a groove can be formed by means of the top of the second sidewall 460. The possibility to subsequently align the contact and the pin is provided by forming a hard mask filling layer in the groove.

Figure 5:
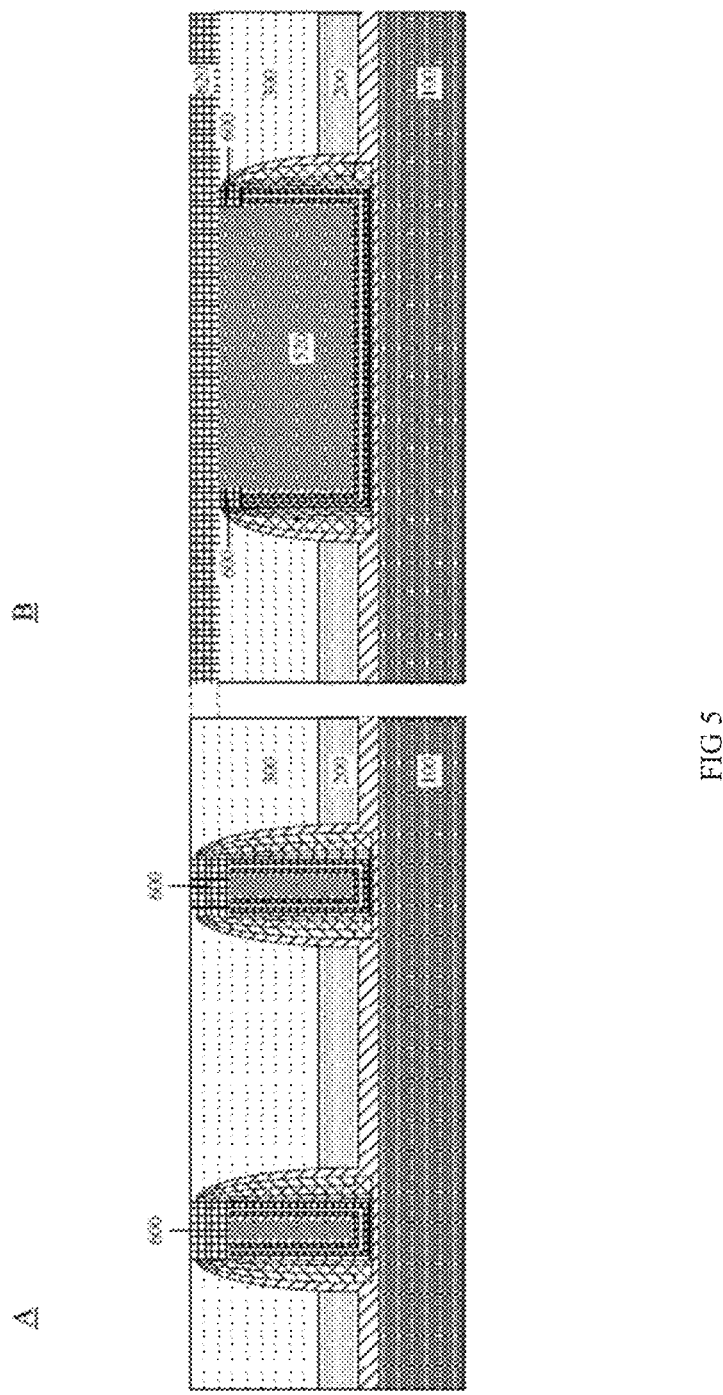

In the above embodiment, a hard mask dielectric layer 620 protruding from the groove can be deposited first, and then the hard mask dielectric layer 620 protruding from the groove is planarized by using the interlayer dielectric layer 300 in the interlayer dense area as an etching stop layer, to form the hard mask filling layer 600 filling the groove, referring to FIGS. 4 and 5. In an embodiment, the above hard mask dielectric layer 620 is made of a silicon nitride, that is, the formed hard mask filling layer 600 is made of a silicon nitride.

Since the tops of the dense area transistor gate 420 and of the isolated area transistor gate 520 are etched back synchronously, and the tops of the first sidewalls 440 and 540 are etched synchronously, the top of the second gate structure 500 is inevitably formed into a structure similar to the top of the first gate structure 400, that is, the top of the first sidewall 540 in the second gate structure 500 is etched, and the hard mask filling layer 600 is formed in a groove formed by the second sidewall 560.

Moreover, since the interlayer dielectric layer 300 in the pattern dense area A is used as the etching stop layer in planarization of the hard mask dielectric layer 620 protruding from the groove and the interlayer dielectric layer 300 in the pattern dense area A is higher than the interlayer dielectric layer 300 in the pattern isolated area B, after the planarization of the hard mask dielectric layer 620, there is a residue of the hard mask dielectric layer 620 on the interlayer dielectric layer 300 in the pattern isolated area B, referring to FIG. 5.

The residue of the hard mask dielectric layer 620 may subsequently cause open circuit or short circuit of the metal contact and the pin, thereby directly impacting the product yield. Therefore, an improvement to the existing process is required.

Figure 6:
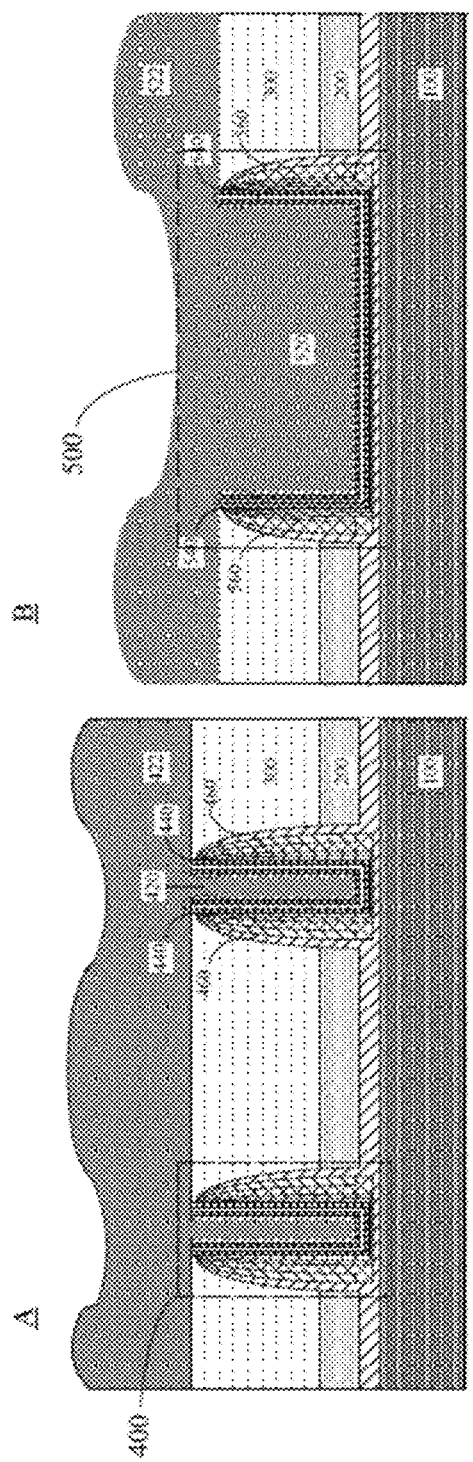
FIGS. 6-11 illustrate schematic structural diagrams of a device in a self-aligned silicon nitride process corresponding to the manufacturing method provided by the present application.

Reference is made to FIGS. 6-11 to understand an improved process provided by the present application. First, FIG. 6 illustrates a schematic structural diagram obtained after a substrate is provided. Similar to FIG. 2, a substrate 100 is provided, and the substrate 100 is divided into a pattern dense area A and a pattern isolated area B according to the width of a device gate. As described above, in an embodiment, the gate width of a device in the pattern dense area A is less than 0.24 micrometers, the gate width of a device in the pattern isolated area B is greater than 0.24 micrometers, and the pattern dense area and the pattern isolated area are determined according to the width of the device gate.

Further, in an embodiment, the semiconductor device processed by the manufacturing method provided by the present application is a fin semiconductor device, and therefore, a fin structure 200 is also formed over the substrate 100. It can be understood that the specific structure and formation method of the above fin structure 200 should not unduly limit the protection scope of the present application.

Referring to FIG. 6, a plurality of first gate structures 400 are formed on the substrate 100 in the pattern dense area A, and each first gate structure 400 includes a dense area transistor gate 420, a first sidewall 440 on either side of the dense area transistor gate 420, and a second sidewall 460 on either side of the first sidewall 440. It can be understood that an interlayer dielectric layer 300 filling a gap between the gate structures is formed on either side of the first gate structure 400. In an embodiment, the interlayer dielectric layer 300 is made of a silicon oxide.

A plurality of second gate structures 500 are formed on the substrate 100 in the pattern isolated area B, and each second gate structure 500 includes an isolated area transistor gate 520, a first sidewall 540 on either side of the isolated area transistor gate 520, and a second sidewall 560 on either side of the first sidewall 540. It can be understood that an interlayer dielectric layer 300 filling a gap between the gate structures is formed on either side of the second gate structure 500. In an embodiment, the interlayer dielectric layer 300 is made of a silicon oxide.

Due to the existence of various component designs with different densities and the limitation by a previous process, the heights of the interlayer dielectric layer 300 in the pattern dense area A and the interlayer dielectric layer 300 in the pattern isolated area B are different. The first gate structure 400 and the interlayer dielectric layer 300 around the first gate structure in the pattern dense area A are higher than the second gate structure 500 and the interlayer dielectric layer 300 around the second gate structure in the pattern isolated area B.

In the above embodiment, the first sidewalls 440 and 540 may be a gate dielectric layer or work function layer of a dense area transistor. Therefore, the first sidewalls 440 and 540 may each include a portion on the substrate 100 and a portion on the dense area transistor gate 420 or on the isolated area transistor gate 520. The second sidewalls 460 and 560 are respectively formed on either side of the first sidewalls 440 and 540. It should be noted that the first sidewalls 440 and 540 and the second sidewalls 460 and 560 can be adjusted according to the performances of different devices. The specific composition of the first sidewalls 440 and 540 and the second sidewalls 460 and 560 should not unduly limit the protection scope of the present application.

FIG. 6 illustrates a specific situation of forming the dense area transistor gate 420 and the isolated area transistor gate 520. The dense area transistor gate 420 and the isolated area transistor gate 520 may be metal gates, that is, gate layers 422 and 522 for filling are metal layers. It can be understood that the metal layer includes but is not limited to metal tungsten.

Figure 7:
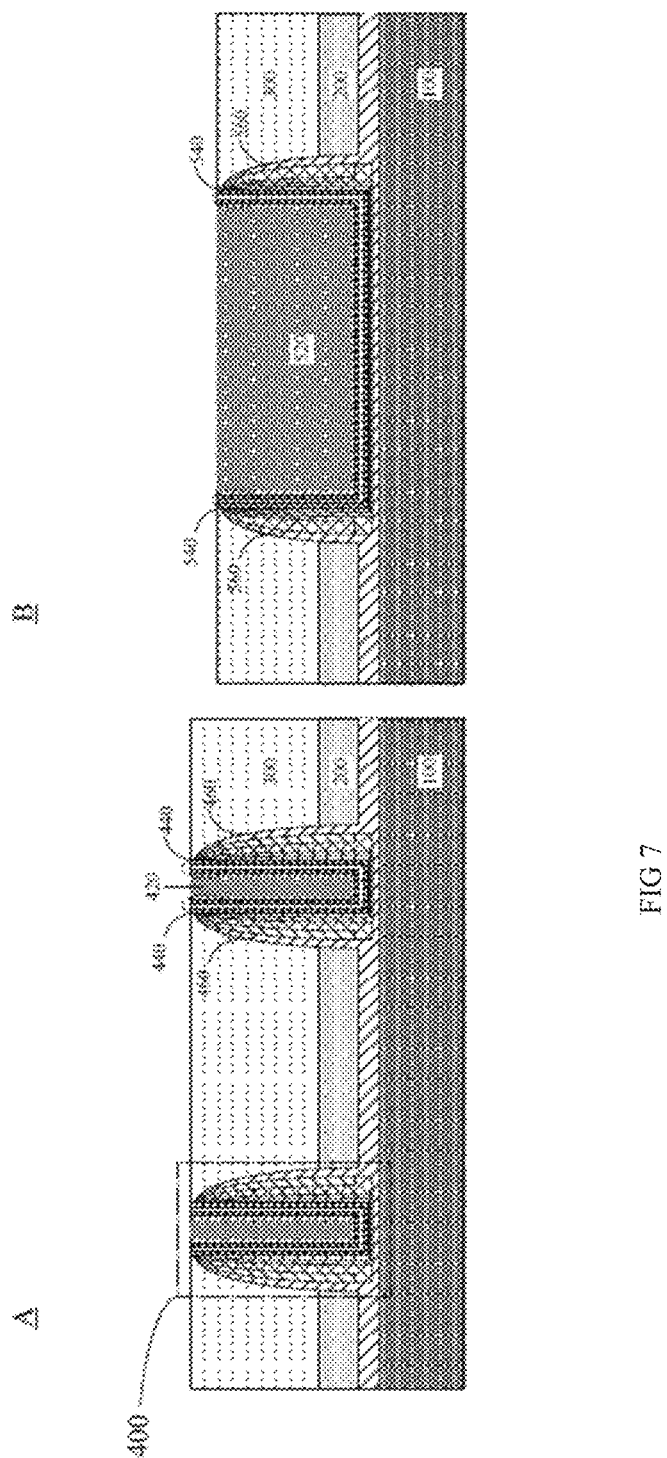

FIG. 7 illustrates a structure obtained after the gate layer 422 and the gate layer 522 are planarized. After planarization of the gate layer 422 and the gate layer 522, the dense area transistor gate 420 and the isolated area transistor gate 520 that are flush with the interlayer dielectric layer 300 can be obtained. In other words, in the planarization of the gate layer 422 and the gate layer 522, the interlayer dielectric layer 300 can be used as an etching stop layer. In FIG. 3, the upper surfaces of the dense area transistor gate 420 and the isolated area transistor gate 520 are exposed.

In the manufacturing method provided by the present application, after the upper surfaces of the dense area transistor gate 420 and the isolated area transistor gate 520 are exposed, a buffer dielectric layer 320 is formed synchronously on the upper surfaces of the interlayer dielectric layers 300 in the pattern dense area A and in the pattern isolated area B. In an embodiment, the buffer dielectric layer 320 is made of a silicon oxide. In the above embodiment, the buffer dielectric layer 320 can be deposited by means of a high-density plasma process, a high-aspect-ratio process, or a plasma-enhanced process. It can be understood that a method for depositing the buffer dielectric layer 320 can be implemented by means of an existing or future technology, and the description of the method for depositing the buffer dielectric layer 320 should not unduly limit the protection scope of the present application.

Figure 8:
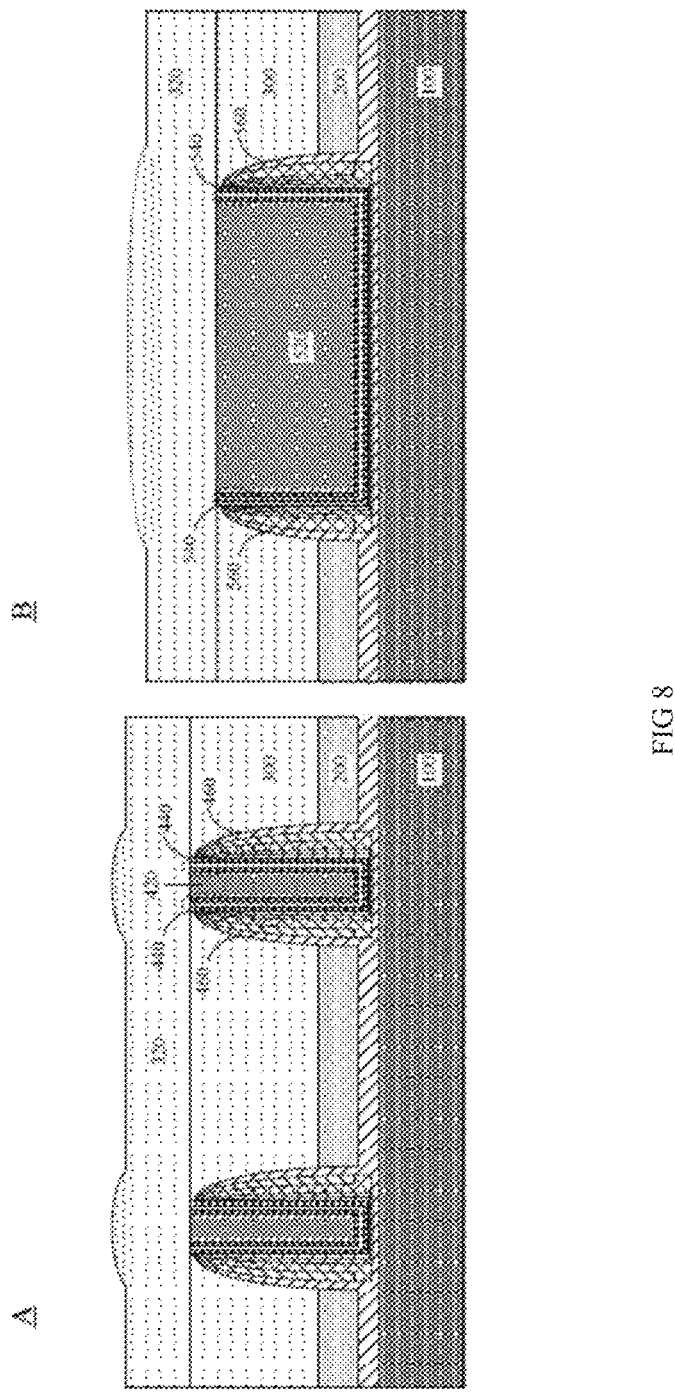

Referring to FIG. 8, the buffer dielectric layer 320 is formed synchronously on the upper surfaces of the interlayer dielectric layers 300 in the pattern dense area A and in the pattern isolated area B, and the upper surface of the buffer dielectric layer 320 in the pattern isolated area B is higher than the upper surface of the first gate structure 400 in the pattern dense area A. In an embodiment, the thickness of the deposited buffer dielectric layer 320 is between 150 angstroms and 1000 angstroms.

Figure 9:
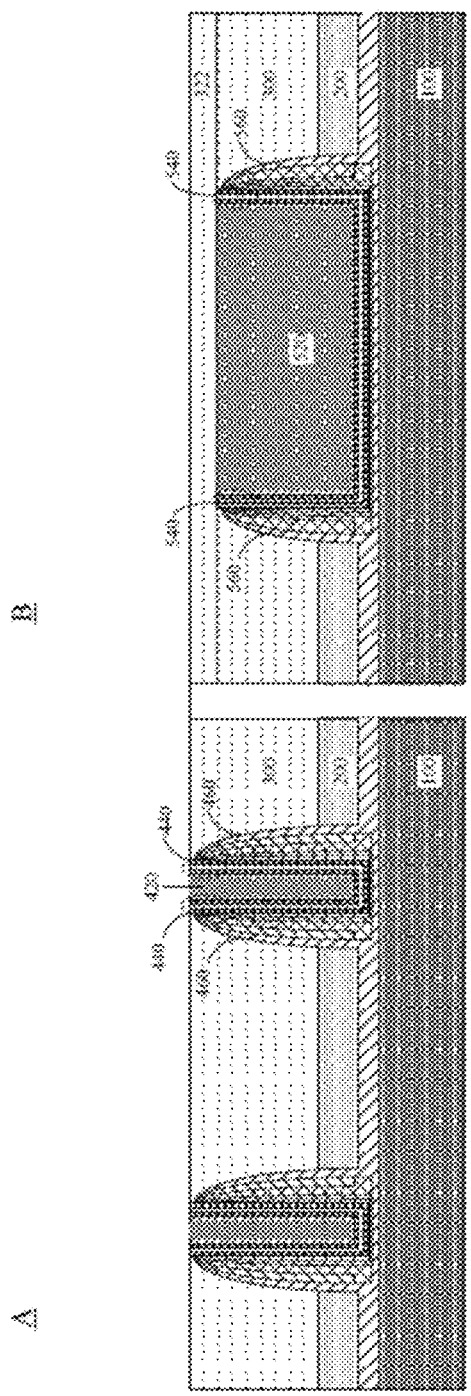

Subsequently, referring to FIG. 9, the buffer dielectric layer 320 is planarized by using the upper surface of the first gate structure 400 as an etching stop layer. It can be seen from FIG. 9 that the buffer dielectric layer 320 formed in the pattern dense area A is completely removed, and the upper surface of the dense area transistor gate 420 in the first gate structure 400 is exposed again. Since there is a height difference between the first gate structure 400 and the second gate structure 500, using the first gate structure 400 as an etching stop layer, a portion of the buffer dielectric layer over the second gate structure 500 and over the interlayer dielectric layer 300 around the second gate structure in the pattern isolated area B are retained to form the buffer layer 322. It can be understood that the upper surface of the buffer layer 322 is flush with the upper surface of the first gate structure 400.

By forming the buffer layer 322 over the second gate structure 500, on the one hand, the height difference between the pattern dense area A and the pattern isolated area B can be eliminated, and on the other hand, the formed buffer layer 322 covers the second gate structure 500 to protect the second gate structure 500.

As stated above, due to the relatively small width of the dense area transistor gate 420, it is difficult to accurately ensure that a contact and a pin are only in contact with the dense area transistor gate 420 in subsequent processes of forming the contact and the pin. Therefore, problems such as short circuit and open circuit are easy to occur, thereby resulting in a reduction in the product yield.

In order to overcome the problem of difficulties in subsequent formation of the contact and the pin that satisfy requirements caused by the relatively small width of the dense area transistor gate 420, the top of the dense area transistor gate 420 can be etched back, and a top area of the first sidewall of the dense area transistor gate 420 is subsequently used to form an alignment area of the contact and the pin.

Figure 10:
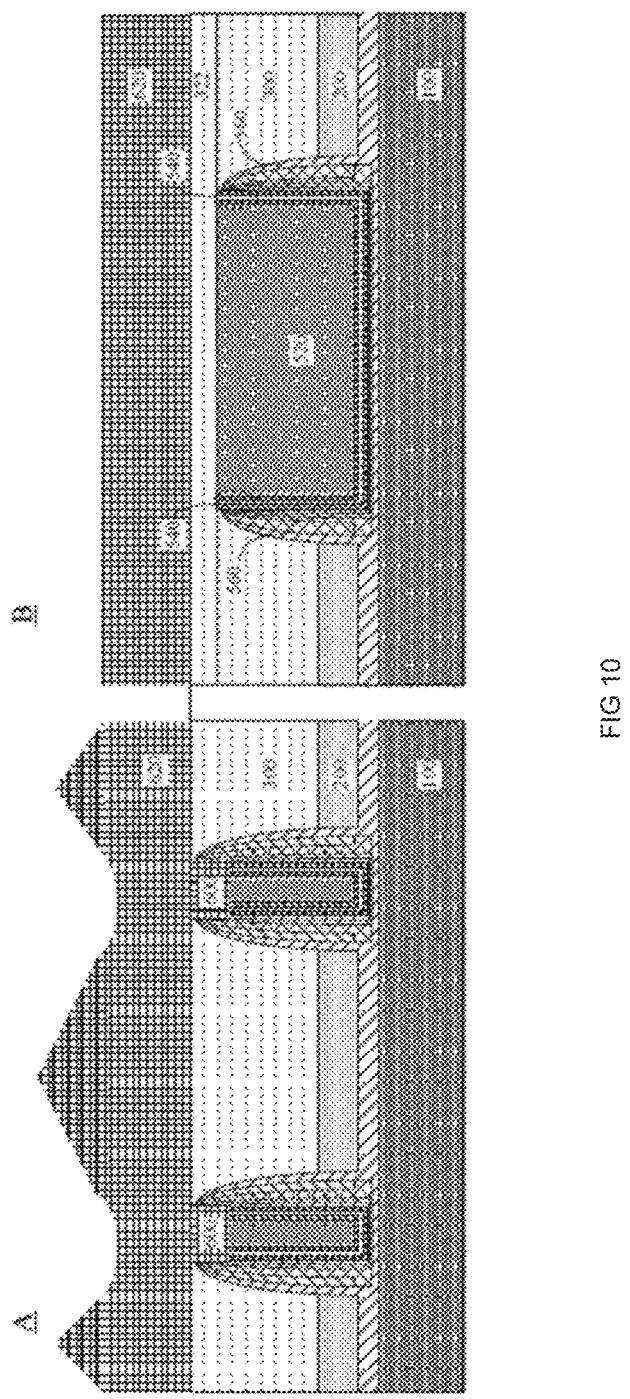

Referring to FIG. 10, it is necessary to etch back the top of the dense area transistor gate 420 and remove the top of the first sidewall 440, so that a groove can be formed by means of the top of the second sidewall 460. The possibility to subsequently align the contact and the pin is provided by forming a hard mask filling layer in the groove.

Figure 11:
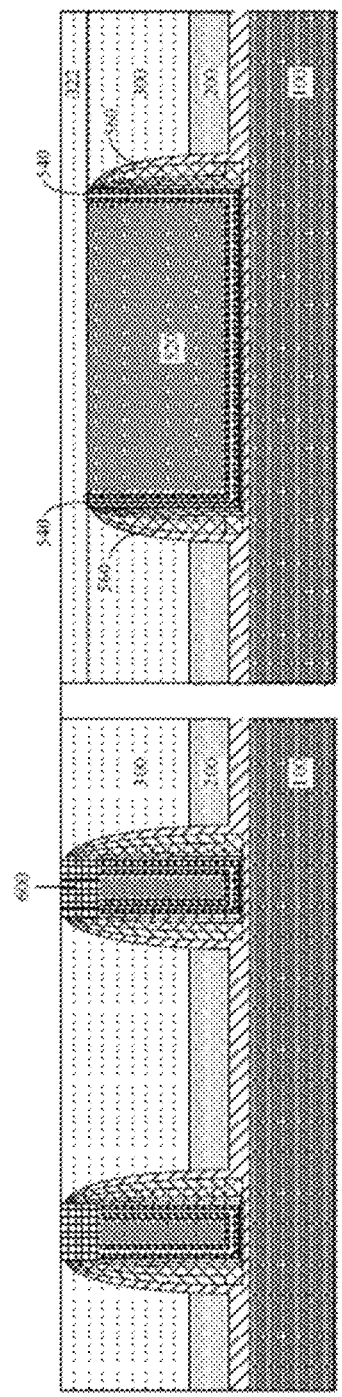

In the above embodiment, a hard mask dielectric layer 620 protruding from the groove can be deposited first, and then the hard mask dielectric layer 620 protruding from the groove is planarized by using the interlayer dielectric layer 300 in the interlayer dense area as an etching stop layer, to form the hard mask filling layer 600 filling the groove, referring to FIGS. 10 and 11. In an embodiment, the above hard mask dielectric layer 620 is made of a silicon nitride, that is, the formed hard mask filling layer 600 is made of a silicon nitride.

Different from that in the prior art, the buffer layer 322 is formed over the second gate structure 500 and the interlayer dielectric layer 300 around the second gate structure in the pattern isolated area B, and therefore, in a process of etching back the top of the dense area transistor gate 420 as well as removing the top of the first sidewall 440, the second gate structure 500 is protected by the buffer layer 322 and subjected to no negative impact.

Furthermore, although the hard mask dielectric layer 620 is formed synchronously in the pattern isolated area B, due to the existence of the buffer layer 322, referring to FIG. 10, the hard mask dielectric layer 620 in the pattern isolated area B is formed on the upper surface of the buffer layer 322.

In planarization of the redundant hard mask dielectric layer 620 in the pattern dense area A and the pattern isolated area B, the interlayer dielectric layer 300 in the pattern dense area A is used as an etching stop layer. The upper surface of the buffer layer 322 is flush with the upper surface of the first gate structure 400, that is, the upper surface of the buffer layer 322 is flush with the upper surface of the interlayer dielectric layer 300 in the pattern dense area A. Therefore, in the planarization of the redundant hard mask dielectric layer 620 in the pattern dense area A and the pattern isolated area B, the redundant hard mask dielectric layer 620 in the pattern dense area A and the pattern isolated area B can be removed completely. Referring to FIG. 11, the upper surface of the pattern dense area A is the formed hard mask filling layer 600, and the upper surface of the pattern isolated area B is the buffer layer 322, thereby avoiding the problem of a hard mask dielectric layer residue on the upper surface of the pattern isolated area B in the prior art. Therefore, the possibility to subsequently avoid open circuit or short circuit of the metal contact and the pin is provided, thereby effectively increasing the product yield and improving the device performance.

It can be understood that all the planarization treatments can be implemented by means of chemical mechanical polishing. In addition, those skilled in the art could implement the planarization treatments by means of an existing or future technology, and the specific implementation of the planarization treatments should not unduly limit the protection scope of the present application.

Although the present disclosure is described with respect to specific exemplary embodiments, it is obvious that various modifications and changes can be made to these embodiments without departing from the broader spirit and scope of the present disclosure. Therefore, the specification and drawings should be construed as being illustrative rather than restrictive.

According to the method for manufacturing a semiconductor device provided by the present application, a severe loading effect caused by an uneven device distribution on a chip can be effectively alleviated by forming a buffer layer on the upper surface of a device in a pattern isolated area. In addition, the formed buffer layer can also subsequently serve as a protective layer for the device in the pattern isolated area, to improve the problem of a silicon nitride residue on the upper surface of a gate structure of an isolated area transistor which undergoes a self-aligned silicon nitride process, thereby effectively improving the performance of the device and increasing the product yield.

It should be understood that this specification will not be used to interpret or limit the scope or meaning of the claims. In addition, in the foregoing detailed description, it can be seen that various features are combined together in a single embodiment for the purpose of simplifying the present disclosure. The method of the present disclosure should not be construed as reflecting that the claimed embodiments require more features than those explicitly listed in each claim. On the contrary, as reflected in the appended claims, the inventive subject matter includes features less than all the features of a single disclosed embodiment. Therefore, the appended claims are hereby incorporated into the detailed description, with each claim independently used as an independent embodiment.

An embodiment or embodiments mentioned in the description are intended to be included in at least one embodiment of a circuit or method in combination with the specific features, structures, or characteristics described in the embodiment. The phrase "an embodiment" in various portions of the specification does not necessarily refer to the same embodiment.

What is claimed is:

1. A method for manufacturing a semiconductor device, comprising:
   providing a substrate, wherein a first gate structure corresponding to a dense area transistor and a second gate structure corresponding to an isolated area transistor are formed on the substrate, and the first gate structure is higher than the second gate structure;
   forming a buffer layer over the second gate structure, wherein an upper surface of the buffer layer is flush with an upper surface of the first gate structure, wherein the forming the buffer layer comprises:
   depositing a buffer dielectric layer covering the first gate structure and the second gate structure over the first gate structure and the second gate structure; and
   planarizing the buffer dielectric layer by using the upper surface of the first gate structure as a stop layer, to re-expose the upper surface of the first gate structure, and retaining the buffer dielectric layer over the second gate structure as the buffer layer; and removing a top of the first gate structure, and forming a hard mask filling layer on a top area of the first gate structure;

wherein the first gate structure further comprises a dense area transistor gate, and a first sidewall and a second sidewall that are sequentially arranged on either side of the dense area transistor gate from inside to outside, the removing the top of the first gate structure comprises:

removing tops of the dense area transistor gate and of the first sidewall on either side thereof; and the forming the hard mask filling layer on the top area of the first gate structure comprises:

forming the hard mask filling layer on top areas of the dense area transistor gate and of the first sidewall on either side thereof.

2. The method for manufacturing the semiconductor device according to claim 1, wherein a first interlayer dielectric layer is formed on either side of the first gate structure, and an upper surface of the first interlayer dielectric layer is flush with the upper surface of the first gate structure;

a second interlayer dielectric layer is formed on either side of the second gate structure, and an upper surface of the second interlayer dielectric layer is flush with the upper surface of the second gate structure; and the deposited buffer dielectric layer also covers the first interlayer dielectric layer and the second interlayer dielectric layer.

3. The method for manufacturing the semiconductor device according to claim 2, wherein each of the buffer dielectric layer, the first interlayer dielectric layer, and the second interlayer dielectric layer is an oxide.

4. The method for manufacturing the semiconductor device according to claim 1, wherein the buffer dielectric layer is deposited by means of a high-density plasma process, a high-aspect-ratio process, or a plasma-enhanced process.

5. The method for manufacturing the semiconductor device according to claim 1, wherein the forming the hard mask filling layer on the top areas of the dense area transistor gate and of the first sidewall on either side thereof comprises:

depositing, in a groove surrounded by the second sidewall, a hard mask dielectric layer protruding from the groove after the tops of the dense area transistor gate and of the first sidewall on either side thereof are removed; and planarizing the hard mask dielectric layer to remove the hard mask dielectric layer protruding from the groove, and retaining the hard mask dielectric layer in the groove as the hard mask filling layer.

6. The method for manufacturing the semiconductor device according to claim 5, wherein the depositing the hard mask dielectric layer comprises:

synchronously depositing the hard mask dielectric layer on the upper surface of the buffer layer; and synchronously planarizing the hard mask dielectric layer over the buffer layer by using the upper surface of the buffer layer as a stop layer, to remove the hard mask dielectric layer over the buffer layer.

7. The method for manufacturing the semiconductor device according to claim 5, wherein the hard mask dielectric layer is a nitride.

8. The method for manufacturing the semiconductor device according to claim 1, wherein the dense area transistor gate is a metal gate; and/or an isolated area transistor gate in the second gate structure is a metal gate.

9. The method for manufacturing the semiconductor device according to claim 1, wherein a gate width of the first gate structure is less than 0.24 micrometers, and a gate width of the second gate structure is greater than 0.24 micrometers.

\* \* \* \* \*